(12) United States Patent
Lee

(10) Patent No.: US 12,001,142 B2
(45) Date of Patent: Jun. 4, 2024

(54) WAFER PROCESSING DEVICE AND METHOD

(71) Applicant: CHANGXIN MEMORY TECHNOLOGIES, INC., Hefei (CN)

(72) Inventor: Shih-Hung Lee, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 299 days.

(21) Appl. No.: 17/431,788

(22) PCT Filed: Mar. 10, 2021

(86) PCT No.: PCT/CN2021/079972
§ 371 (c)(1),
(2) Date: Aug. 18, 2021

(87) PCT Pub. No.: WO2021/190305
PCT Pub. Date: Sep. 30, 2021

(65) Prior Publication Data
US 2022/0317574 A1     Oct. 6, 2022

(30) Foreign Application Priority Data

Mar. 27, 2020   (CN) ......................... 202010228540.0

(51) Int. Cl.
*G03F 7/42*     (2006.01)
(52) U.S. Cl.
CPC ................... *G03F 7/423* (2013.01)
(58) Field of Classification Search
CPC . G03F 7/423; G03F 7/42; G03F 7/427; G03F 7/422
See application file for complete search history.

(56) References Cited

U.S. PATENT DOCUMENTS 6,559,064 B1    5/2003   Shimizu
9,529,267 B2 *  12/2016  Rho ..................... H01L 21/6708
(Continued)

FOREIGN PATENT DOCUMENTS

CN    1291347 A    4/2001
CN    1480996 A    3/2004
(Continued)

OTHER PUBLICATIONS

ISR for International Application PCT/CN2021/079972 dated Jun. 3, 2021.
(Continued)

*Primary Examiner* — Deoram Persaud
(74) *Attorney, Agent, or Firm* — Ladas & Parry LLP

(57) ABSTRACT

The present application relates to a wafer processing device and a wafer processing method. The wafer processing device includes: a spraying unit configured to spray a photoresist-removing solution to remove a photoresist; and a heating unit mounted to the spraying unit and configured to heat the photoresist-removing solution to a preset temperature. According to the wafer processing device and wafer processing method of the present application, the photoresist-removing solution is heated to a preset temperature, so that the photoresist-removing solution dissolves the photoresist more rapidly and thoroughly. Therefore, the photoresist may be removed from a surface of the wafer more thoroughly, and further a yield of the wafer is increased.

16 Claims, 3 Drawing Sheets

(56) References Cited

U.S. PATENT DOCUMENTS

| | | | |
|---|---|---|---|
| 9,991,141 B2* | 6/2018 | Muramoto | B08B 3/04 |
| 11,295,947 B2* | 4/2022 | Shirai | C11D 3/04 |
| 2004/0261817 A1* | 12/2004 | Araki | H01L 21/67051 |
| | | | 134/102.1 |
| 2006/0081180 A1* | 4/2006 | Aoki | H01L 21/6715 |
| | | | 118/313 |
| 2008/0113086 A1* | 5/2008 | Akita | C23C 16/4557 |
| | | | 118/724 |
| 2009/0181552 A1* | 7/2009 | Shimomura | H01L 21/268 |
| | | | 438/795 |
| 2010/0154833 A1* | 6/2010 | Endo | G03F 7/3057 |
| | | | 134/105 |
| 2013/0025636 A1* | 1/2013 | Kurokawa | H01L 21/67028 |
| | | | 134/105 |
| 2014/0206195 A1* | 7/2014 | Lauerhaas | H01L 21/6708 |
| | | | 438/700 |
| 2014/0216499 A1* | 8/2014 | Li | C11D 7/06 |
| | | | 134/3 |

FOREIGN PATENT DOCUMENTS

| | | |
|---|---|---|
| CN | 1650235 A | 8/2005 |
| CN | 1763916 A | 4/2006 |
| CN | 101354542 A | 1/2009 |
| CN | 101398637 A | 4/2009 |
| CN | 101937842 A | 1/2011 |
| CN | 101943868 A | 1/2011 |
| CN | 102782807 A | 11/2012 |
| TW | 201530268 A | 8/2015 |
| TW | I497566 B | 8/2015 |

OTHER PUBLICATIONS

Written Opinion for International Application PCT/CN2021/079972 dated Jun. 3, 2021.

First Office Action of CN application No. 202010228540.0, dated Nov. 29, 2022.

Saga K, et al. "Ion Implanted Photoresist Stripping using Supercritical Carbon Dioxide", 208th Meeting of the Electrochemical Society, Los Angeles, CA. 2005.

Hirose K, et al. "Ion-Implanted Photoresist and Damage-Free Stripping", Journal of the Electrochemical Society, 1994, 141(1): 192-205.

McOmber J I, et al. "Development of a process to achieve residue-free photoresist removal after high-dose ion implantation", Nuclear Instruments and Methods in Physics Research Section B: Beam Interactions with Materials and Atoms, 1991, 55: 281-286.

Chavez K L, et al. "Ion-implanted photoresist removal using water/carbon dioxide mixtures at elevated temperature and pressure", Journal of Vacuum Science & Technology B: Microelectronics and Nanometer Structures Processing, Measurement, and Phenomena, 2001, 19(6): 2144-2148.

DeKraker, David, et al. "Steam-injected SPM process for all-wet stripping of implanted photoresist", Solid State Phenomena. vol. 145-146, Trans Tech Publications, 2009.

Christenson K K, et al. "All wet stripping of implanted photoresist", Solid State Phenomena. Trans Tech Publications, 2008, 134: 109-112.

Kern W. "Overview and evolution of silicon wafer cleaning technology", Handbook of silicon wafer cleaning technology. William Andrew Publishing, 2018: 3-85.

Cui Y, et al. "Interface Modification in solar cell contact electrode using pre-cleaning treatment chemistries", Journal of nanoscience and nanotechnology, vol. 14, 2014, 14(12): 9401-9405.

Song J I, et al. "Using an ozonated-DI-water technology for photoresist removal", Micro Magazine, in Proceedings of the Surface Conditioning/Chemistries, Jan. 2001.

Bellandi, Enrico, et al. "All-Wet Stripping of FEOL Photoresist Using Mixtures of Sulphuric Acid", Solid State Phenomena. vol. 134. Trans Tech Publications, 2008.

Third Office Action of the Chinese application No. 202010228540.0, dated Oct. 13, 2023. 9 pages with English abstract.

* cited by examiner

WAFER PROCESSING DEVICE AND METHOD

CROSS-REFERENCE TO RELATED APPLICATIONS

The present application is a national stage entry of International Patent Application No. PCT/CN2021/079972, filed on Mar. 10, 2021, which claims priority of Chinese Patent Application No. 202010228540.0, filed on Mar. 27, 2020. The aforementioned patent applications are incorporated by reference in their entirety.

TECHNICAL FIELD

The present application relates to the field of semiconductor manufacturing and processing, and more particularly to a wafer processing device and a wafer processing method.

BACKGROUND

The lithography technology is generally applied in manufacturing semiconductor devices. The lithography technology is to transfer a pattern on a mask onto a wafer by means of a photoresist under illumination of light. A main process of the lithography technology is described below: firstly, ultraviolet light illuminates a surface of a wafer attached with a photoresist thin-film layer by means of the mask, which causes the photoresist in an exposed area to undergo a chemical reaction; then the photoresist in the exposed area or the photoresist in an unexposed area (the former is called as a positive photoresist, and the latter is called as a negative photoresist) is removed by dissolution via the development technology, so that a pattern on the mask is copied onto the photoresist thin-film layer; and finally, the pattern is transferred onto the wafer by utilizing the etching technology.

After the lithography is completed, it is necessary to remove the photoresist from the surface of the wafer. However, the photoresist is difficult to be removed completely. Moreover, there is a possibility that the wafer itself may be damaged in a removal process, resulting in a significant decrease in yield of the wafer.

SUMMARY

In some embodiments, a wafer processing device is disclosed as below. The wafer processing device includes: a spraying unit configured to spray a photoresist-removing solution so as to remove a photoresist; and a heating unit mounted to the spraying unit and configured to heat the photoresist-removing solution to a preset temperature.

In some embodiments, a wafer processing method is disclosed below, which includes a step of removing a photoresist from a surface of a wafer by spraying a photoresist-removing solution and the following step: heating a photoresist-removing solution to be sprayed to a preset temperature.

According to the wafer processing device and method as disclosed, the photoresist-removing solution is heated to a preset temperature, so that the photoresist-removing solution dissolves the photoresist more rapidly and thoroughly. Therefore, the photoresist may be removed from the surface of the wafer more thoroughly, and further the yield of the wafer is increased.

BRIEF DESCRIPTION OF DRAWINGS

To describe the technical solutions in the embodiments of the present application more clearly, the following briefly introduces the accompanying drawings required for describing the embodiments of the present application. Apparently, the accompanying drawings in the following description show merely some embodiments of the present application, and a person of ordinary skill in the art may still derive other drawings from these accompanying drawings without creative efforts.

DETAILED DESCRIPTION OF EMBODIMENTS

Studies have found that the reason why a photoresist is incompletely removed is that when a surface of a wafer on which a photoresist layer is formed is subjected to exposure treatment or ion implantation, a hardening layer is easily formed on an upper surface of the photoresist layer. The hardening layer is difficult to be peeled off, which may make it difficult to remove completely the photoresist from the surface of the wafer.

If by-products of the photoresist are incompletely removed before a subsequent process is performed, the yield may decrease and a processing apparatus may be contaminated. Generally, the photoresist is removed more thoroughly by a method of prolonging the time for the photoresist-removing solution to react with the photoresist. However, this prolongs the process time and increases the consumption of the photoresist-removing solution, resulting in an increased cost. Moreover, the photoresist-removing solution used is likely to be unrecyclable, and environmental problems may occur if excessive photoresist-removing solution is used. In addition, more deionized water (DIW) is required to wash for longer time if more photoresist-removing solution is used to perform a reaction for longer time, resulting in a waste of the deionized water.

In order to further clarify the objectives, technical means and effects of the present application, the present application is further elaborated below in conjunction with accompanying drawings. It should be understood that the embodiments described herein are only a part of embodiments of the present application, not all of the embodiments, and are not intended to limit the present application. Based on the embodiments in the present application, all other embodiments acquired by those skilled in the art without creative efforts shall fall within the protection scope of the present application.

Figure 1:
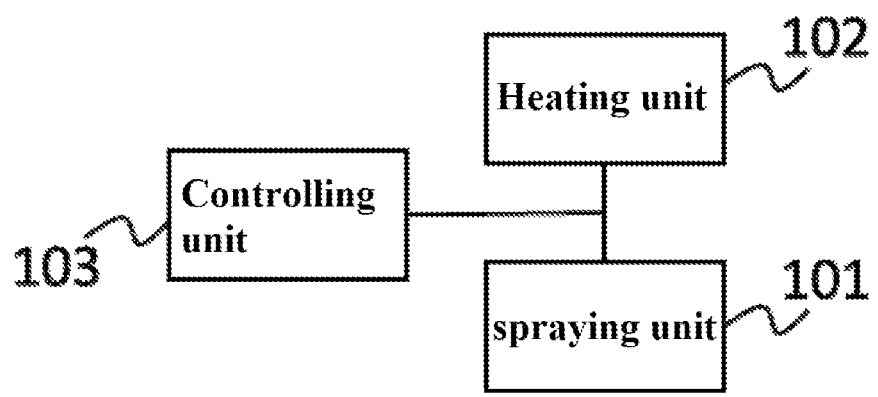
FIG. 1 is a schematic structural diagram showing a wafer processing device according to an embodiment of the present application.
Figure 2:
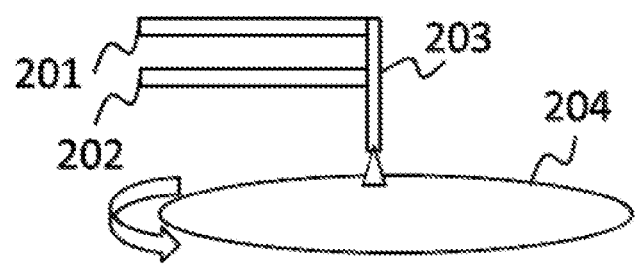
FIG. 2 is a schematic structural diagram showing a wafer processing device from which a heating unit is removed according to an embodiment of the present application.

Reference is made to FIG. 1 and FIG. 2, wherein FIG. 1 is a schematic structural diagram showing a wafer processing device in which a heating unit 102 is provided according to an embodiment of the present application, and FIG. 2 is a schematic structural diagram of a wafer processing device from which a heating unit is removed according to an embodiment of the present application.

In the embodiment shown in FIG. 1, there is provided a wafer processing device. The wafer processing device has a spraying unit 101 capable of spraying a photoresist-removing solution to remove the photoresist. The wafer processing device further includes a heating unit 102 mounted to the spraying unit 101 and configured to heat the photoresist-removing solution to a preset temperature.

The wafer processing device in this embodiment heats the photoresist-removing solution to the preset temperature, so that the photoresist-removing solution dissolves the photoresist more rapidly and thoroughly. Therefore, the photoresist may be removed from a surface of a wafer 204 more thoroughly.

In an embodiment, the spraying unit 101 includes a photoresist-removing solution nozzle configured to spray a photoresist-removing solution to remove the photoresist. In an embodiment, the photoresist-removing solution nozzle is disposed toward the photoresist to be removed. In fact, since the photoresist to be removed may be disposed at different positions on the wafer 204, in some embodiments, the spraying unit 101 is configured as a movable spraying unit 101 in order to achieve better effects, and may be moved automatically or manually by means of a mechanical arm or a movable structure.

In fact, multiple spraying units 101 may be provided as needed.

In an embodiment, the photoresist-removing solution includes a mixed solution of sulfuric acid and hydrogen peroxide (Sulfuric Peroxide Mixing, SPM, solution), which is a strong oxidant and may serve to remove organic residues, including the photoresist, on the wafer.

In this embodiment, before the photoresist-removing solution is sprayed to a wafer to be cleaned, hydrogen peroxide may be sprayed on the surface of the wafer, in order to achieve a better cleaning effect. In this embodiment, a photoresist-removing nozzle is used to spray the hydrogen peroxide. By this time, only the hydrogen peroxide is introduced into a mixed solution pipeline connected to the photoresist-removing nozzle, and sulfuric acid is not introduced. In this way, the hydrogen peroxide is sprayed. Such an operation method has no effect on the photoresist-removing solution sprayed from the photoresist-removing solution nozzle.

In this embodiment, the spraying unit 101 further includes: a sulfuric acid pipeline 201 configured to provide sulfuric acid and connected to the photoresist-removing solution nozzle; a hydrogen peroxide pipeline 202 configured to provide hydrogen peroxide and connected to the photoresist-removing solution nozzle, wherein the photoresist-removing solution nozzle is further configured to spray the hydrogen peroxide; and a mixed solution pipeline 203 connected to the sulfuric acid pipeline 201 and the hydrogen peroxide pipeline 202, respectively and connected to the photoresist-removing solution nozzle so that the mixed solution of sulfuric acid and hydrogen peroxide is formed and flows to the photoresist-removing solution nozzle.

In this embodiment, the heating unit 102 is mounted outside the mixed solution pipeline 203 and configured to heat the mixed solution of sulfuric acid and hydrogen peroxide in the mixed solution pipeline 203.

In this embodiment, the sulfuric acid pipeline 201 and the hydrogen peroxide pipeline 202 are respectively configured to connect to a sulfuric acid source and a hydrogen peroxide source. Moreover, the hydrogen peroxide pipeline 202, the sulfuric acid pipeline 201 and the mixed solution pipeline 203 have a certain resistance, and may resist acid corrosion so as to prevent the hydrogen peroxide pipeline 202, the sulfuric acid pipeline 201 and the mixed solution pipeline 203 from being damaged as their operation duration increases.

In an embodiment, the hydrogen peroxide pipeline 202, the sulfuric acid pipeline 201 and the mixed solution pipeline 203 are all made of ceramics. In fact, other materials, such as polytetrafluoroethylene, polyvinyl chloride, etc., may be chosen to manufacture the hydrogen peroxide pipeline 202, the sulfuric acid pipeline 201 and the mixed solution pipeline 203 as required.

In an embodiment, a ratio of $H_2SO_4$ to $H_2O_2$ in the mixed solution of sulfuric acid and hydrogen peroxide is (1 to 10):1. In addition, the $H_2SO_4$ has a concentration of 96 wt % and the $H_2O_2$ has a concentration of 31 wt %. In this case, the photoresist may be effectively removed, and a cost of the mixed solution of sulfuric acid and hydrogen peroxide may be controlled as well.

In an embodiment, a mixing ratio of the mixed solution of sulfuric acid and hydrogen peroxide sprayed from the photoresist-removing solution nozzle is preferably $H_2SO_4$:$H_2O_2$-2:1. When $H_2SO_4$:$H_2O_2$-2:1, a temperature of the mixed solution of sulfuric acid and hydrogen peroxide when flowing out of the photoresist-removing solution nozzle is increased to the preset temperature, which may effectively improve the efficiency of removing the photoresist by the mixed solution of sulfuric acid and hydrogen peroxide.

In an embodiment, the $H_2SO_4$ has a flow rate ranging from 50 ml/min to 2000 ml/min, and the $H_2O_2$ has a flow rate ranging from 50 ml/min to 2000 ml/min. The sulfuric acid and the hydrogen peroxide are introduced for less than 300 s. In an embodiment, the $H_2SO_4$ and the $H_2O_2$ have flow rates ranging from 50 ml/min to 2000 ml/min and are introduced for about 30 s to 60 s.

A mixed solution of sulfuric acid and hydrogen peroxide with a spraying temperature of about 160° C. is generally used, and is sprayed for at least 120 s, in order to ensure a sufficient photoresist removing effect. When preparing the mixed solution of sulfuric acid and hydrogen peroxide with the spraying temperature of about 160° C., it is generally necessary to ensure that the $H_2SO_4$ has a flow rate of at least 600 ml/min, the $H_2O_2$ has a flow rate of at least 300 ml/min, and a total consumption amount of the $H_2SO_4$ and the $H_2O_2$ is at least 1800 ml. When using this recipe of the mixed solution and the wafer processing method, an effect achieved in removing the photoresist is poor. That is, the photoresist remains on the surface of the wafer 204 finally, resulting in a poor photoresist removing effect.

In an embodiment, the temperature of the mixed solution of sulfuric acid and hydrogen peroxide flowing out of the mixed solution pipeline is about 200° C. due to being heated by the heating unit 102, and spraying duration may be shortened to less than 60 s. Accordingly, the consumption amount of the sulfuric acid and the hydrogen peroxide is reduced, and the sufficient photoresist removing effect is achieved. In some embodiments, the spraying duration of the mixed solution of sulfuric acid and hydrogen peroxide is 30 s. By this time, the total consumption amount of the $H_2SO_4$ and the $H_2O_2$ is at least 300 ml, the flow rate of $H_2SO_4$ is at least 400 ml/min, and the flow rate of $H_2O_2$ is at least 200 ml/min. When the photoresist is removed from the surface of the wafer 204 by using the recipe of the mixed solution in this embodiment, there is no photoresist residue on the surface of the wafer 204, thereby achieving a better photoresist removing effect.

Figure 3:
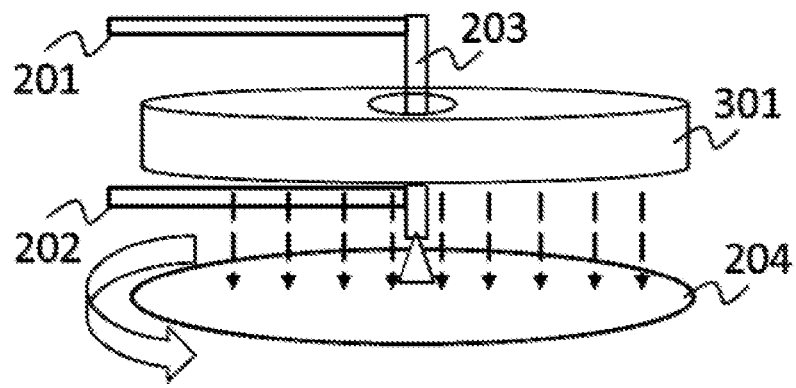
FIG. 3 is a three-dimensional schematic diagram showing a wafer processing device according to an embodiment of the present application.

In an embodiment, the heating unit 102 is disposed on the mixed solution pipeline 203 and configured to heat the mixed solution of sulfuric acid and hydrogen peroxide in the mixed solution pipeline 203. Reference is made to FIG. 3, which is a three-dimensional schematic diagram showing a wafer processing device according to an embodiment of the present application. In this embodiment, the heating unit 102 is mounted to the mixed solution pipeline 203 and disposed between the sulfuric acid pipeline 201 and the hydrogen peroxide pipeline 202.

Figure 4:
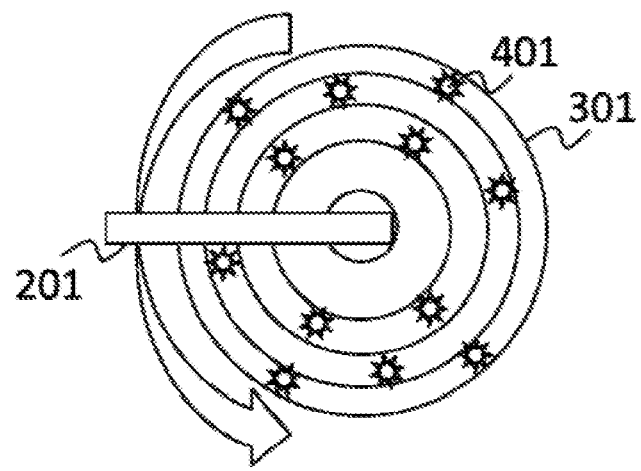
FIG. 4 is a schematic top view showing a wafer processing device according to an embodiment of the present application.

Reference is made to FIG. 3 and FIG. 4, wherein FIG. 4 is a schematic top view showing a wafer processing device according to an embodiment of the present application. In the embodiments shown in FIG. 3 and FIG. 4, the heating unit 102 includes a barrier 301 disposed around the photoresist-removing solution nozzle. Moreover, the heating unit 102 further includes at least two heating lamps 401 which are evenly disposed on a surface of the barrier 301.

In this embodiment, the barrier 301 is a circular barrier 301 with a side edge, and the mixed solution pipeline penetrates the center of the circular barrier 301 with the side edge. A more uniform blocking effect may be achieved by providing the circular barrier 301 with the side edge. In fact, the barrier 301 is not limited to the circular barrier 301 with the side edge during selection, and a square barrier 301 with a side edge, a triangular barrier 301 with a side edge and the like may be selected as the barrier.

In this embodiment, the heating lamps 401 are disposed toward a spraying direction of the mixed solution of sulfuric acid and hydrogen peroxide, and distributed on a surface of one side of the barrier 301 facing the spraying direction of the mixed solution of sulfuric acid and hydrogen peroxide. In this way, most of energy from the heating lamp 401 may be collected by the sprayed mixed solution of sulfuric acid and hydrogen peroxide, so as to improve the energy conversion efficiency. The power consumption required to heat the sulfuric acid may be reduced due to the adoption of the heating lamps 401, and the mixed solution of sulfuric acid and hydrogen peroxide may be heated to a higher temperature, such as 250° C., with lower energy. In addition, a temperature of the heated mixed solution of sulfuric acid and hydrogen peroxide may be better adjusted by means of the heating lamps 401.

A heating effect of the heating unit 102 may be ensured by providing multiple heating lamps 401. Since the heating lamps 401 are evenly disposed on the surface of the barrier 301, the heating unit 102 evenly heats the mixed solution of sulfuric acid and hydrogen peroxide.

Theoretically, a method of winding a heating wire on the mixed solution pipeline 203 may be adopted to control the temperature of the mixed solution of sulfuric acid and hydrogen peroxide in the mixed solution pipeline 203. The $H_2SO_4$ in the sulfuric acid pipeline 201, the $H_2O_2$ in the hydrogen peroxide pipeline 202 and the mixed solution pipeline 203 are not directly heated, because high temperature may damage components of the removing solution nozzle, and instantaneous high temperature of the mixing solution may cause defects or damages of a nitride film layer and a polysilicon line on the surface of the wafer.

In this embodiment, the temperature of the $H_2SO_4$ introduced into the sulfuric acid pipeline 201 ranges from 70° C. to 110° C., and the temperature of the $H_2O_2$ introduced into the hydrogen peroxide pipeline 202 ranges from 22° C. to 26° C. In fact, the $H_2O_2$ in the hydrogen peroxide pipeline 202 may be kept at a room temperature. In this embodiment, the $H_2SO_4$ and the $H_2O_2$ may not damage the sulfuric acid pipeline 201 and the hydrogen peroxide pipeline 202.

In an embodiment, the heating lamp 401 includes an LED lamp, and the preset temperature is at least 200° C. The mixed solution of sulfuric acid and hydrogen peroxide is heated to 200° C. by means of a LED lamp set. The LED lamp set has a heating power ranging from 500 W to 5000 W when its voltage ranges from 110V to 380V, and heating duration ranges from 5 s to 120 s. It may be seen from this set of data that the mixed solution of sulfuric acid and hydrogen peroxide may be heated more rapidly by means of the LED lamps, which may increase a processing speed of removing the photoresist by the wafer processing device.

In an embodiment, the spraying unit 101 further includes an ozone-dissolved deionized water nozzle configured to spray ozone-dissolved deionized water, and a concentration of ozone dissolved in the ozone-dissolved deionized water ranges between 100 ppm to 150 ppm. In this embodiment, the photoresist to be removed is sprayed by using the ozone-dissolved deionized water, and the photoresist residue on the surface of the wafer 204 may be directly oxidized. Therefore, as spraying the ozone-dissolved deionized water, the photoresist on the surface of the wafer 204 is thinned, which facilitates subsequent cleaning of the photoresist by the mixed solution of sulfuric acid and hydrogen peroxide. Herein, reference is made to the following chemical formula:

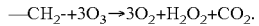

$$—CH_2\text{-}+3O_3 \rightarrow 3O_2+H_2O_2+CO_2.$$

In this embodiment, the ozone-dissolved deionized water is sprayed by using the ozone-dissolved deionized water nozzle, so that a photoresist removing rate may be effectively increased, metal pollution is reduced, and the spraying duration required when the mixed solution of sulfuric acid and hydrogen peroxide is removed is reduced. An area from which the photoresist is to be removed is sprayed by using the ozone-dissolved deionized water, so that the surface of the wafer 204 may eventually have a better VPD-TXRF (Vapor Phase Decomposition-Total Reflectance X-ray Fluorescence, serving to detect metal stains on the surface of the wafer 204) result, this is caused by an oxidation reaction of metal impurities on the surface of the wafer with ozone in the ozone-dissolved deionized water.

In an embodiment, a dissolution fraction of ozone dissolved in the ozone-dissolved deionized water ranges from 100 ppm to 150 ppm. It should be noted that the dissolution fraction here refers to a dissolution fraction at a room temperature, and the room temperature refers to 22° C. to 26° C.

After the photoresist removing solution is sprayed, it is necessary to spray deionized water (DIW) onto the surface of the photoresist to be removed. If only pure deionized water is sprayed, the spraying duration is at least 67 s. Therefore, in this case, there is a need for more deionized water to be used, which is likely to cause a waste of resources.

In one embodiment, after the photoresist removing solution is sprayed, when the ozone-dissolved deionized water is sprayed on the wafer 204 to remove the mixed solution of sulfuric acid and hydrogen peroxide in an area where the photoresist is disposed, spraying duration of the ozone-dissolved deionized water may be shortened to less than 30 s. Furthermore, a flow rate of the ozone-dissolved deionized water is at least 2000 ml/min. Accordingly, an amount of the deionized water consumed by the photoresist removing solution for cleaning the surface of the area where the photoresist is disposed may be reduced, and the waste of resources is reduced.

Figure 5:
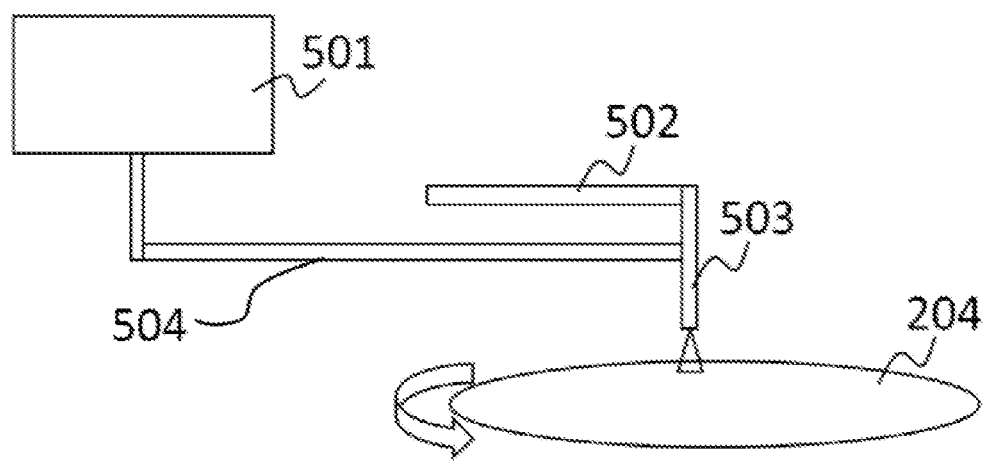
FIG. 5 is a schematic structural diagram showing an ozone-dissolved deionized water nozzle of a wafer processing device according to an embodiment of the present application.

Reference is made to FIG. 5, which is a schematic structural diagram showing an ozone-dissolved deionized water nozzle of a wafer processing device according to an embodiment of the present application. In the embodiment shown in FIG. 5, the ozone-dissolved deionized water nozzle includes an ozone pipeline 504, a deionized water pipeline 502 and a mixed solution pipeline 503. The mixed solution pipeline 503 is respectively connected to the ozone pipeline 504 and the deionized water pipeline 502 and configured to mix ozone flowing in the ozone pipeline 504 and deionized water flowing in the deionized water pipeline 502, respectively so as to make the ozone be dissolved in the deionized water.

In this embodiment, the ozone-dissolved deionized water nozzle is disposed toward the wafer 204 to be sprayed as well. In fact, the ozone-dissolved deionized water nozzle is disposed toward the photoresist to be removed.

In this embodiment, an ozone generator 501 is connected to the ozone pipeline 504, so as to provide ozone to be dissolved in the deionized water to the ozone-dissolved deionized water.

In an embodiment, the wafer processing device further includes a control unit 103 connected to the ozone-dissolved deionized water nozzle, the photoresist-removing solution nozzle and the heating unit 102 and configured to control spraying operations of the ozone-dissolved deionized water nozzle and of the photoresist-removing solution nozzle as well as a heating operation of the heating unit 102. The preset temperature is at least 200° C.

The spraying operations of the nozzles and the heating operation of the heating unit 102 may be controlled by providing the control unit 103, so that the wafer processing device may automatically implement a wafer processing method, that is, a method of firstly spraying the ozone-dissolved deionized water to an area from which the photoresist is to be removed, then spraying the mixed solution of sulfuric acid and hydrogen peroxide to the area, and finally spraying the ozone-dissolved deionized water to the area. The automatic implementation facilitates an operation of an operator and ensures that the wafer processing device may process the photoresist according to preset rules, thereby ensuring a photoresist processing effect of the wafer processing device.

In an embodiment, the control unit 103 includes at least one of a microcontroller, a single-chip microcomputer or a programmable logic device.

A wafer processing method is further provided below, which includes a step of removing a photoresist by spraying a photoresist-removing solution, and further includes the following step: heating a photoresist-removing solution to be sprayed to a preset temperature.

In an embodiment, the method further includes the following steps: spraying hydrogen peroxide on the surface of the wafer before spraying the photoresist-removing solution; and spraying ozone-dissolved deionized water on the surface of the wafer after spraying the photoresist-removing solution.

In an embodiment, when the ozone-dissolved deionized water is sprayed on the surface of the wafer after the photoresist-removing solution is sprayed, the hydrogen peroxide is sprayed on the surface of the wafer as well.

In an embodiment, the preset temperature is at least 200° C., and a dissolution fraction of ozone in the ozone-dissolved deionized water ranges from 100 ppm to 150 ppm.

In an embodiment, before the photoresist-removing solution is sprayed, the hydrogen peroxide is sprayed on the surface of the wafer at a flow rate ranging from 50 ml/min to 2000 ml/min and with duration of less than 180 s. After the photoresist-removing solution is sprayed, the ozone-dissolved deionized water is sprayed on the surface of the wafer at a flow rate ranging from 500 ml/min to 2500 ml/min and with duration of less than 300 s.

In this embodiment, before the photoresist-removing solution is sprayed, the wafer spraying method further includes the following step: preparing the photoresist-removing solution, wherein the photoresist-removing solution includes a mixed solution of sulfuric acid and hydrogen peroxide which is acquired by mixing sulfuric acid at 70° C. to 110° C. with hydrogen peroxide at 22° C. to 26° C.

In an embodiment, the mixed solution of sulfuric acid and hydrogen peroxide is acquired by mixing sulfuric acid at 90° C. with hydrogen peroxide at 25° C.

When preparing the mixed solution of sulfuric acid and hydrogen peroxide, a mixed solution pipeline is provided to mix the sulfuric acid with the hydrogen peroxide. When preparing the mixed solution of sulfuric acid and hydrogen peroxide, the sulfuric acid and the hydrogen peroxide are introduced into the mixed solution pipeline, wherein the sulfuric acid has a flow rate ranging from 50 ml/min to 2000 ml/min, and the hydrogen peroxide has a flow rate ranging from 50 ml/min to 2000 ml/min. The mixed solution of sulfuric acid and hydrogen peroxide is sprayed on the surface of the wafer for less than 300 s.

In an embodiment, the $H_2SO_4$ and the $H_2O_2$ have flow rates ranging from 50 ml/min to 2000 ml/min and duration of about 30 s to 60 s.

By the wafer processing method in this embodiment, the photoresist-removing solution is heated to a preset temperature, so that the photoresist-removing solution dissolves the photoresist more rapidly and thoroughly. Therefore, the photoresist on the surface of the wafer 204 may be removed more thoroughly.

The descriptions above are only preferred embodiments of the present application. It should be noted that for a person of ordinary skill in the art, several improvements and modifications may be made without departing from the principle of the present application. These improvements and modifications should be considered as within the scope of protection of the present application.

The invention claimed is:

1. A wafer processing device, comprising:
   a spraying unit, configured to spray a photoresist-removing; solution so as to remove a photoresist on a surface of a wafer; and
   a heating unit, mounted to the spraying unit and configured to heat the photoresist-removing solution to a preset temperature;
   wherein the spraying unit comprises:
      a photoresist-removing solution nozzle, configured to spray the photoresist-removing solution so as to remove the photoresist, wherein the photoresist-removing solution comprises a mixed solution of sulfuric acid and hydrogen peroxide:
      a sulfuric acid pipeline, configured to provide sulfuric acid and connected to the photoresist-removing solution nozzle;
      a hydrogen peroxide pipeline, configured to provide hydrogen peroxide and connected to the photoresist-removing solution nozzle, wherein the photoresist-removing solution nozzle is further configured to spray the hydrogen peroxide; and
      a mixed solution pipeline, connected to the sulfuric acid pipeline and the hydrogen peroxide pipeline, respectively and connected to the photoresist-removing solution nozzle so that the mixed solution of sulfuric acid and hydrogen peroxide is formed and flows to the photoresist-removing solution nozzle;

wherein the heating unit is mounted outside the mixed solution pipeline and configured to heat the mixed solution of sulfuric acid and hydrogen peroxide in the mixed solution pipeline;

the heating unit comprises a barrier disposed around the photoresist-removing solution nozzle and at least two heating lamps evenly disposed on a surface of the barrier; and the at least two heating lamps are disposed toward a spraying direction of the mixed solution of sulfuric acid and hydrogen peroxide.

2. The wafer processing device according to claim 1, wherein the barrier has a side wall.

3. The wafer processing device according to claim 1, wherein the spraying unit further comprises an ozone-dissolved deionized water nozzle configured to spray ozone-dissolved deionized water, wherein a concentration of ozone dissolved in the ozone-dissolved deionized water ranges between 100 ppm to 150 ppm.

4. The wafer processing device according to claim 3, further comprises a control unit, wherein the control unit is connected to the ozone-dissolved deionized water nozzle, the photoresist-removing solution nozzle and the heating unit, and configured to control spraying operations of the ozone-dissolved deionized water nozzle and of the photoresist-removing solution nozzle as well as a heating operation of the heating unit.

5. The wafer processing device according to claim 1, wherein the preset temperature is at least 200° C.

6. The wafer processing device according to claim 1, wherein the spraying unit is movable.

7. A wafer processing method, comprising a step of removing a photoresist from a surface of a wafer by spraying a photoresist-removing solution and the following steps:
    providing the wafer processing device according to claim 1;
    heating the photoresist-removing solution to the preset temperature by using the at least two heating lamps; and
    spraying the photoresist-removing solution with the preset temperature by the photoresist-removing solution nozzle to remove the photoresist from the surface of the wafer.

8. The wafer processing method according to claim 7, further comprising the following steps:
    spraying hydrogen peroxide on the surface of the wafer before spraying the photoresist-removing solution; and
    spraying ozone-dissolved deionized water on the surface of the wafer after spraying the photoresist-removing solution.

9. The wafer processing method according to claim 8, wherein a concentration of ozone dissolved in the ozone-dissolved deionized water ranges between 100 ppm to 150 ppm.

10. The wafer processing method according to claim 8, wherein before the photoresist-removing solution is sprayed, the hydrogen peroxide is sprayed on the surface of the wafer at a flow rate ranging from 50 ml/min to 2000 ml/min and with a duration of less than 180 s.

11. The wafer processing method according to claim 8, wherein after the photoresist-removing solution is sprayed, the ozone-dissolved deionized water is sprayed on the surface of the wafer at a flow rate ranging from 500 ml/min to 2500 ml/min and a duration of less than 300 s.

12. The wafer processing method according to claim 7, wherein the preset temperature is at least 200° C.

13. The wafer processing method according to claim 7, wherein before the photoresist-removing solution is sprayed, the method fluffier comprises the following step:
    preparing the photoresist-removing solution, wherein the photoresist-removing solution comprises a mixed solution of sulfuric acid and hydrogen peroxide acquired by mixing the sulfuric acid at 70° C. to 110° C. with the hydrogen peroxide at 22° C. to 26° C.

14. The wafer processing method according to claim 13, wherein a ratio of $H_2SO_4$ to $H_2O_2$ in the mixed solution of sulfuric acid and hydrogen peroxide is (1 to 10):1.

15. The wafer processing method according to claim 13, wherein when preparing the mixed solution of sulfuric acid and hydrogen peroxide, a mixed solution pipeline is provided to mix the sulfuric acid with the hydrogen peroxide.

16. The water processing method according to claim 15, wherein when preparing the mixed solution of sulfuric acid and hydrogen peroxide, the sulfuric acid and the hydrogen peroxide are inlet into the mixed solution pipeline, wherein the sulfuric acid has a flow rate ranging from 50 ml/min to 2000 ml/min, and the hydrogen peroxide has a flow rate ranging from 50 ml/min to 2000 ml/min; and the mixed solution of sulfuric acid and hydrogen peroxide is sprayed on the surface of the wafer for less than 300 s.

* * * * *